United States Patent
Diepstraten et al.

(10) Patent No.: US 10,576,567 B2
(45) Date of Patent: Mar. 3, 2020

(54) REFLOW SOLDERING OVEN WITH AT LEAST ONE GAS PURIFICATION SYSTEM COMPRISING A CATALYST UNIT

(71) Applicant: Illinois Tool Works Inc., Glenview, IL (US)

(72) Inventors: Gerardus Johannes Adrianus Maria Diepstraten, Dongen (NL); Antonie Cornelis Colijn, Nieuwendijk (NL)

(73) Assignee: Illinois Tool Works Inc., Glenview, IL (US)

( * ) Notice: Subject to any disclaimer, the term of this patent is extended or adjusted under 35 U.S.C. 154(b) by 281 days.

(21) Appl. No.: 15/546,032

(22) PCT Filed: Jan. 26, 2016

(86) PCT No.: PCT/US2016/014915
§ 371 (c)(1),
(2) Date: Jul. 25, 2017

(87) PCT Pub. No.: WO2016/126463
PCT Pub. Date: Aug. 11, 2016

(65) Prior Publication Data
US 2018/0333796 A1 Nov. 22, 2018

(30) Foreign Application Priority Data
Feb. 4, 2015 (EP) .................... 15153866

(51) Int. Cl.
*B23K 37/00* (2006.01)
*B23K 3/08* (2006.01)
(Continued)

(52) U.S. Cl.
CPC ............... *B23K 3/08* (2013.01); *B23K 1/008* (2013.01); *B23K 1/0016* (2013.01); *B23K 1/20* (2013.01);
(Continued)

(58) Field of Classification Search
CPC . B23K 3/08; B23K 3/04; B23K 1/203; B23K 1/0016; B23K 1/008; B23K 1/20; B23K 2101/42; H05K 3/3494
See application file for complete search history.

(56) References Cited

U.S. PATENT DOCUMENTS 3,995,991 A * 12/1976 Wilkinson ............ F24H 3/0488
432/222
4,938,410 A * 7/1990 Kondo ................... B23K 1/008
219/388
(Continued)

FOREIGN PATENT DOCUMENTS

CN 1036682 A 10/1989
CN 1665632 A 9/2005
(Continued)

OTHER PUBLICATIONS

Database WPI, Week 200662, Thomson Scientific, London, GB; AN 2006-597089, XP002756294, & JP 2006 202985 A (Suzuki KK) Aug. 3, 2006 (Aug. 3, 2006).
(Continued)

*Primary Examiner* — Kiley S Stoner
(74) *Attorney, Agent, or Firm* — Lando & Anastasi, LLP

(57) ABSTRACT

The present application relates to a reflow soldering oven (1) for soldering an electronic circuit board (300), the oven (1) comprising a gas purification system (11, 21) for purifying gas that contains flux components vaporized from the electronic circuit board (300). The gas purification system further comprises at least one gas purification unit (11, 21) comprising a catalyst unit comprising a catalyst material. The invention further relates to a corresponding reflow soldering method.

14 Claims, 3 Drawing Sheets

Figure 1:
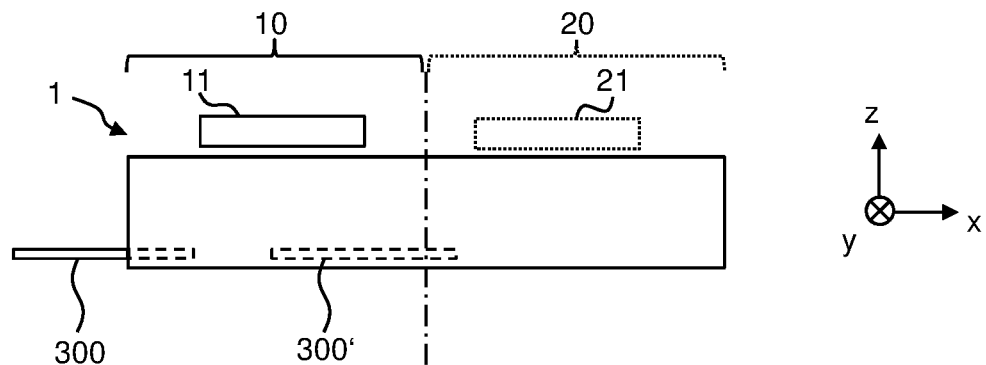

(51) Int. Cl.
*B23K 1/008* (2006.01)
*B23K 1/20* (2006.01)
*B23K 1/00* (2006.01)
*B23K 3/04* (2006.01)
*H05K 3/34* (2006.01)
*B23K 101/42* (2006.01)

(52) U.S. Cl.
CPC ................ B23K 1/203 (2013.01); B23K 3/04 (2013.01); H05K 3/3494 (2013.01); *B23K 2101/42* (2018.08)

(56) References Cited

U.S. PATENT DOCUMENTS

| | | | | |
|---|---|---|---|---|
| 5,295,621 | A * | 3/1994 | Tsujimoto | H05K 3/3489 228/219 |
| 5,417,774 | A * | 5/1995 | Garg | B22F 3/1007 148/208 |
| 5,579,981 | A * | 12/1996 | Matsumura | B23K 1/008 228/19 |
| 5,715,990 | A * | 2/1998 | Taniguchi | B23K 1/008 228/234.1 |
| 5,971,255 | A * | 10/1999 | Yamamoto | B23K 1/0014 228/181 |
| 6,780,225 | B2 | 8/2004 | Shaw et al. | |
| 7,766,651 | B2 | 8/2010 | Asai et al. | |
| 8,883,667 | B2 | 11/2014 | Nakano et al. | |
| 9,028,248 | B2 * | 5/2015 | Zurhove | B01D 53/64 432/14 |
| 2003/0218058 | A1 * | 11/2003 | Shaw | B23K 1/012 228/230 |
| 2007/0131736 | A1 * | 6/2007 | Dong | B23K 1/206 228/220 |
| 2007/0284408 | A1 * | 12/2007 | Asai | B23K 1/0016 228/42 |
| 2008/0014542 | A1 * | 1/2008 | Asai | B23K 1/008 432/121 |
| 2008/0295686 | A1 | 12/2008 | Neiderman et al. | |
| 2009/0129999 | A1 * | 5/2009 | Shimazu | B23K 1/0008 422/600 |
| 2009/0324454 | A1 * | 12/2009 | Nakano | B01D 53/8668 422/177 |

FOREIGN PATENT DOCUMENTS

| | | | | |
|---|---|---|---|---|
| CN | 101048042 | A * | 10/2007 | .......... B23K 1/0016 |
| CN | 101085487 | A * | 12/2007 | .......... B23K 1/0016 |
| CN | 201086166 | Y | 7/2008 | |
| CN | 101522305 | A | 9/2009 | |
| JP | 06114548 | A * | 4/1994 | |
| JP | 2006202985 | A | 8/2006 | |
| JP | 2007273571 | A * | 10/2007 | ............. B23K 1/008 |
| JP | 2007329376 | A | 12/2007 | |
| WO | WO-2008047639 | A1 * | 4/2008 | ......... B01D 53/8668 |

OTHER PUBLICATIONS

Notification of Transmittal of the International Search Report and the Written Opinion of the International Searching Authority from corresponding PCT/US2016/014915 dated Apr. 20, 2016.

* cited by examiner

REFLOW SOLDERING OVEN WITH AT LEAST ONE GAS PURIFICATION SYSTEM COMPRISING A CATALYST UNIT

CROSS-REFERENCE TO RELATED APPLICATIONS

This application is the U.S. National Phase Application under 35 U.S.C. § 371 of International Application No. PCT/US2016/014915, filed Jan. 26, 2016, which claims priority to European Patent Application No. EP15153866.7, filed Feb. 4, 2015. These prior applications are incorporated by reference herein in their entirety.

This invention relates to reflow ovens and methods for reflow soldering. According to the U.S. Pat. No. 7,766,651 B2, a reflow oven comprises especially: an ambient gas purification equipment including a retrieving device to retrieve a part of the ambient gas containing vaporized flux component when soldering, a heating device to heat the retrieved ambient gas to a desired temperature, an oxidation catalyst to burn the flux component contained in the heated ambient gas, and a returning device to return a high temperature gas after being burned to the heating chamber. According to the description of the US patent, the flux component in the ambient gas is effectively burned, the temperature of the heating chamber is controlled without applying a specific cooling means, and the necessary heating in the heating chamber is lowered.

The inventors found it still disadvantageous that the cleaning efficiency of the gas purification equipment was low. The object of the invention therefore was to enhance the cleaning efficiency of the gas purification equipment.

This object is achieved by the subject matter of the independent claims; preferred embodiments are specified by the dependent claims.

Particularly, this object is particularly achieved by a reflow soldering oven for soldering an electronic circuit board, the oven comprising a gas purification system for purifying gas that contains flux components vaporized from the electronic circuit board, wherein the gas purification system comprises at least one gas purification unit comprising a catalyst unit comprising a catalyst material.

The object of the invention is also particularly achieved by a method for reflow soldering an electronic circuit board by a reflow soldering oven, wherein gas that contains flux components vaporized from the electronic circuit board is purified by a gas purification system, whereby, at one gas purification unit comprising a catalyst unit comprising a catalyst material is used to purify the gas.

Hereby, the gas can be cleaned more efficiently. The different gas purification units can be adapted to the amount of vapor in the zone or group of zones to which the respective gas purification unit is dedicated. Hence cleaning capacity/energy can be adapted to a needed level at a certain zone in the oven.

Preferably, gas may be air or a specific inert gas or inert gas mixture used inside the soldering oven, like for example nitrogen. If air flow is mentioned, this stands for both, air flow or gas flow, depending on the type of gas inside the oven.

Preferably, a gas purification unit has cleaning means configured to clean gas according to the following cleaning principles: at least catalytic cleaning and preferably additionally cleaning by condensation of vaporized flux components on a condenser within the gas purification unit. A condenser is preferably a component or area inside the gas purification unit featuring a surface area equipped with cooling means, for condensing vapor on that surface area. The gas purification unit(s) can be arranged inside the oven or outside the oven using a suitable air/gas duct system.

In a further preferred embodiment according to the invention the oven comprises a control unit controlling (or configured or programmed to control) a temperature of gas impinging on the catalyst material of the at least one gas purification unit, preferably two, three, more and/or all of the gas purification units, within the range of 180-215° C. In a further preferred method according to the invention a temperature of gas impinging on the catalyst material of the at least one gas purification unit is controlled within the range of 180-215° C.

Hereby, a very energy efficient operation is possible. It was surprisingly found that cleaning performance at such low temperatures is sufficient. For operating efficiently in that low temperature range, preferably, the catalyst material comprises at least one metal out of the platinum group, particularly preferably two or more metals out of the platinum group. Particularly preferred, the catalyst temperature of gas impinging on the catalyst material of the at least one gas purification unit is controlled to 210° C.

In a further preferred embodiment or method according to the invention the at least one gas purification unit is dedicated to a Cool zone of the reflow soldering oven.

Hereby, the air in the cool zone can be cleaned efficiently with no or only minimal effect on the cooling performance. A Cool zone is commonly known to one skilled in the art. It is a zone after or subsequent to a Reflow zone. Preferably, the gas in the Cool zone is controlled having a temperature in the range of 70°-110° C., preferably 80°-100° C. The set point of the cooling unit in the Cool zone is preferably 90° C. Preferably, the temperature of gas impinging on the catalyst material of the at least one gas purification unit dedicated to the Cool zone is controlled within the range of 180-215° C., or preferably to 210° C., which is providing advantageous cooling and cleaning efficiency.

In a further preferred embodiment according to the invention the oven comprises a cleaning exhaust, or multiple cleaning exhausts, through which gas to be cleaned by the at least one gas purification unit can be exhausted, e.g. out of the oven. In a further preferred method according to the invention gas to be cleaned is exhausted through a cleaning exhaust.

The exhaust is preferably an orifice in an inner wall of the oven.

In a further preferred embodiment according to the invention the oven comprises a blower box chamber having a wall permeably to air, preferably a perforated wall, facing a travel path of the electronic circuit board, and preferably separating/delimiting the blower box chamber from the travel path, preferably adjacent, particularly preferably surrounding at two or three sides: a return chamber;

and a fan, which is configured to suck gas from the return chamber, blow it into the blower box chamber and then through the wall onto the electronic circuit board, wherein the blower box comprises the cleaning exhaust to which a pipe is connected which pipe is connected an inlet of the gas purification unit.

In a further preferred method according to the invention a fan is operated to suck gas from the return chamber, blow it into the blower box chamber and then through the perforated wall onto the electronic circuit board, Hereby, the unit uses the overpressure (generated by the fan in the zone, respectively the blower box chamber) to transport the gas through the oven. The gas runs through the cleaning device preferably without additional fan or motor; it is integrated in the existing oven concept, using the fan already typically existing in a blower box. Further, at the same time air flow is optimized and the oven maintenance is less often necessary as the fan is working in a cleaner environment than if the air flow was reversed. A pipe could equally be instead another sort of duct, like a channel or the like.

Preferably, the fan is arranged directly next or adjacent to an orifice connecting blower box chamber and return chamber. Preferably the travel path of gas at the position of the electronic circuit board through the return chamber to the fan is longer than the travel path from the fan through the blower box to the electronic circuit board. Hence the polluted gas has more time for condensating e.g. on the walls of the return chamber. Preferably the return chamber surrounds the blower box at least partially and it has at least one vertical outer wall. The vertical outer wall can be used advantageously for collecting condensated flux components.

Preferably multiple zones of the oven each comprise such arrangement of blower box chamber and return chamber.

In a further preferred embodiment according to the invention the return chamber comprises a cleaning inlet to which a pipe is connected which pipe is connected to an outlet of the gas purification unit. In a further preferred method according to the invention air is sucked by the fan from the catalyst through a cleaning inlet into the return chamber.

Hereby, in addition, negative pressure is used for enhancing the air flow through the catalyst.

In a further preferred embodiment according to the invention the cleaning exhaust extends (preferably horizontally) across a travel path of the electronic circuit board. In a further preferred method according to the invention gas is exhausted by a cleaning exhaust extending across a travel path of the electronic circuit board.

Hereby, an enhancement with respect to homogenous air purification is provided. Preferably the extension of the exhaust horizontally across the travel path of the electronic circuit board is at least 30%, preferably at least 50%, particularly preferably at least 75% and most preferred at least 90% of the inner horizontal width of the oven (perpendicular to the travel direction)

In a further preferred embodiment or method according to the invention the cleaning exhaust, especially such cleaning exhaust extending across a travel path of the electronic circuit board, is arranged between two zones of the reflow soldering oven.

Hereby the cleanness grade of local atmospheres in the two neighboring zones can be separated advantageously.

In a further preferred embodiment or method according to the invention one of the two zones of the reflow soldering oven is a Peak (or Reflow) zone and the other zone is subsequent in travel direction of the electronic circuit board and is a Cool zone.

Hereby the catalyst of the gas purification unit will clean especially this most contaminated gas. Preferably it will be recycled in the exit baffle (gas curtain) of the oven. Peak zone and Cool zone are zones commonly known to one skilled in the art, referring to the different phases of the reflow soldering thermal profile.

In a further preferred embodiment according to the invention the gas purification system is connected to the oven using a gas duct system, wherein the gas duct system comprises a Venturi pump (Injector) having an injection connector for external gas feeding such that the external gas accelerates a gas flow inside the gas duct system. In a further preferred method according to the invention an external gas is injected into the gas duct system for accelerating the gas flow inside the gas duct system.

Hereby, gas flow through the catalyst is enhanced. Preferably a gas source of (comparably clean) inert gas, e.g. Nitrogen, is connected to the injection connector of the Venturi pump. The inert gas is injected/purged into the connector and the overpressure is used to accelerate the air flow inside the duct system/catalyst. Preferably, the gas purification unit is arranged outside the oven, e.g. on the outer housing of the oven.

In a further preferred embodiment according to the invention oven comprises a duct connecting an outlet of the at least one gas purification unit to a gas curtain at the entrance or exit of the oven. In a further preferred method according to the invention gas from the catalyst is recycled into the gas curtain of the oven exit or entrance.

Hereby special clean air can be used for the gas curtains, which is important for preventing staining of the electronic circuit board. Due to the catalyst the process gas is exceptional clean that nearly no dirt will be found in tubes or process area after the catalyst. The gas curtain avoids air to enter the oven. Preferably the outlet of a catalyst is connected to both, upper and lower gas curtain of the exit or entrance of the oven.

In a further preferred embodiment according to the invention the Venturi pump is arranged in a part of the duct system connecting said at least one gas purification unit, the outlet of which is connected to the gas curtain at the entrance or exit of the oven, to the oven. In a further preferred method according to the invention external gas (preferably Nitrogen) is purged into a part of the duct system connecting such gas purification unit to the oven which has an outlet connected to the gas curtain at the entrance or exit of the oven.

Hereby, gas curtain air quality is further enhanced. Preferably, the injection takes place in the part of the duct system connecting the inlet of the gas purification unit to the oven.

In a further preferred embodiment according to the invention the gas purification system comprises at least two gas purification units, wherein the at least two gas purification units are dedicated to different zones of the reflow soldering oven. In a further preferred method according to the invention at least two gas purification units are used to purify gas originating from different zones of the reflow soldering oven.

Hereby, the gas can be cleaned more efficiently. The different gas purification units can be adapted to the amount of vapor in the zone or group of zones to which the respective gas purification unit is dedicated. Hence cleaning capacity/energy can be adapted to a needed level at a certain zone in the oven.

Preferably, more than two gas purification units are present, e.g. 3, 4, 5 or more. Preferably, each of the zones or group of zones of the soldering oven has its own dedicated gas purification unit. Preferably a gas purification unit additionally comprises a particle filter, e.g. a particle filter after a catalyst.

Preferably, each of the at least two gas purification units comprises a gas inlet, configured to guide gas from the electronic circuit board inside the oven to the inside of the gas purification unit, e.g. to catalyst material, and an outlet, configured to guide cleaned gas from the inside of the gas purification unit, e.g. from the catalyst material, back to the inside of the oven or to the outside of the oven. Preferably, each of the at least two gas purification units defines an air/gas cycle or a part of such cycle forcing gas through the gas purification unit, e.g. through the catalyst material of the respective gas purification unit. At least one or each of the at least two gas purification units may further comprise means for controlling the air flow (actively: e.g., a fan; and/or passively: e.g., a predetermined or adjustable orifice) and/or a heating element, for heating the gas to a temperature optimized or adapted for the cleaning, e.g. for a catalysis with a catalyst material. Preferably one or more of the gas purification units comprises a particle filter, e.g. a metal or paper filter.

Preferably, one gas purification unit is at least partially directing cleaned gas from its inside, e.g. from its catalyst material, further into another of the at least two gas purification units. The first gas purification unit is thereby serving as a pre-filter. The second gas purification unit is taking in gas not only from the first gas purification unit, but also from at least one different zone of the oven and/or even yet another gas purification unit; hence, the second gas purification unit is merging at least two different air flows.

Preferably, a zone of the reflow soldering oven is an area inside the oven and the circuit board to be soldered is travelling through the zone. Preferably, it is an area that is being controlled to remain at a stable temperature and/or air flow condition. Usually, a reflow soldering oven has multiple such zones that differ from each other with respect to controlled temperature and/or air flow condition for creating a desired temperature/air flow profile along circuit board travel (e.g., for creating along travel a certain pre-heat time, a soak time, a reflow time and cooling time). Particularly preferably, a zone of the reflow soldering oven is defined by having its own temperature control (e.g. using a zone-dedicated heater) and/or air flow control (e.g. using a zone-dedicated fan and/or zone-dedicated air-flow-determining perforations). Preferably, the zones are separated from each other by a gap area that has no air flow perforations below and/or underneath the circuit board travel.

Preferably, the at least two gas purification units being dedicated to different zones may be understood as one gas purification unit being dedicated to one specific zone or group of zones and the other gas purification unit being dedicated to a different zone or a different group of zones. A different group of zones is present, if the one group differs in at least one zone present or not present compared to the other zone or group of zones. Preferably, dedicated to zones further means that at least 75%, preferably at least 90% of gas being directed into the dedicated gas purification unit originates from the zone or group of zones the gas purification unit is dedicated to. For example, a gas purification unit has an air flow at the intake of 100 volume-units per minute (whereas, for example, gas in each zone is circulating with an air flow of 1000 volume-units per minute), at least 75 volume-units per minute are originating from the zone, to which the gas purification is unit dedicated, and less than 25 volume-units per minute are originating from somewhere else, e.g. a neighboring zone.

Example for a dedication of gas purification units to zones: a first gas purification unit may be dedicated to zone 1, a second gas purification unit to only zone 2 or to the group containing zone 1 and zone 2. Another example: a first gas purification unit may be dedicated to zone 1, zone 2 and zone 3, and a second gas purification to zone 3 and zone 4.

In a further preferred embodiment according to the invention the oven comprises two ducts, a first duct connecting an outlet of at least one of the at least two gas purification units to a gas curtain at the entrance of the oven, a second duct connecting an outlet of another of the at least two gas purification units to a gas curtain at the exit of the oven.

Hereby, the efficiency of the system is enhanced. The length of the ducts can be minimized. E.g., the one gas purification unit is arranged closer to the entrance of the oven while the other gas purification unit is arranged closer to the exit of the oven. Preferably, the outputs of several gas purification units (e.g. of the gas purification units of zone 1 and 2 and/or 3) are combined into the gas curtain at the entrance or exit of the oven.

In a further preferred embodiment or method according to the present invention the at least one gas purification unit or several or all of the existing gas purification units are preferably arranged outside of the oven and are each housed in a housing having an extension $e_x$ in the horizontal direction parallel to the travel direction of the electronic circuit board and an extension $e_z$ in the vertical direction perpendicular to the travel direction of the travel direction of the electronic circuit board, wherein $e_x > e_z$.

Hereby, the air flow is enhanced and space used very advantageously. Preferably, the ratio $e_x/e_z >= 2$, particularly $>= 3$. Preferably, the housing is a horizontally extending cylinder, preferably the cylinder axis is substantially parallel to the travel direction of the electronic circuit board.

In a further preferred embodiment or method according to the present invention at least two of the different zones are arranged in series to each other along a travel direction of the electronic circuit board.

Hereby, the different gas purification units are dedicated to different zones along circuit board travel direction. Variations in vapor are expected especially along travel direction as the temperature/air flow profile is changing in this direction, and therefore, gas purification units can be advantageously adapted to the variations in vapor.

In series to each other along a travel direction of the electronic circuit board may preferably be understood as an arrangement of the at least two zones where the circuit board, when travelling through the oven, is passing at first through one of these zones and then through the other of these zones.

In a further preferred embodiment according to the present invention the at least two gas purification units differ from each other in at least one of the following:

an air flow through the gas purification unit;

an amount of heating or cooling down the gas (preferably within the gas purification unit);

an amount of particle filtering (preferably within the gas purification unit);

a cleaning principle or combination of cleaning principles realized by the gas purification unit, wherein a cleaning principle is one of the following: catalytic cleaning, cleaning by condensation of vaporized flux components on a condenser within the gas purification unit. In a further preferred method according to the invention, air flow through and/or heating or cooling by the at least two gas purification units is controlled differently and/or different amounts of particle filtering or different cleaning principles or combination of cleaning principles are accordingly used.

Hereby, the cleaning performance of the gas purification units can be adapted to the locally different cleaning needs advantageously and in a flexible way.

Preferably, the air flow through the gas purification unit dedicated to a zone, in which a high vaporization due to the soldering process is present (e.g., a zone corresponding at least partly to the reflow phase of the solder process), is set or controlled to a higher level than the air flow through the different gas purification unit dedicated to a zone, in which a low or lower vaporization due to the soldering process is present (e.g., a zone corresponding at least partly to the soak phase of the soldering process). Preferably, different air flows in different gas purification units are achieved by differently configured means for controlling the air flow (actively: e.g., a fan; and/or passively: e.g., a predetermined or adjustable orifice). Hereby, the different air flow conditions through the different gas purification units compensate for the locally different vaporization in the oven.

Preferably, the amount of heating the gas by a gas purification unit dedicated to a zone, in which a high temperature due to the soldering process is present (e.g., a zone corresponding at least partly to the reflow phase of the solder process), is set or controlled to a lower level (or even zero) than the amount of heating of the gas by a different gas purification unit dedicated to a zone, in which a low or lower temperature due to the soldering process is present (e.g., a zone corresponding at least partly to the soak phase of the soldering process). Preferably, different amounts of heating of the gas in different gas purification units are achieved by differently configured means for controlling the heating or by the absence of heating in one gas purification unit whereas heating is present in another gas purification unit. The different heating makes use of the locally different temperature in the oven. Heating is only done where needed and hence, energy consumption is lowered.

Furthermore, in the case the gas purification unit has a condenser for purifying the gas, the amount of cooling the gas by a gas purification unit dedicated to a zone, in which a high temperature due to the soldering process is present (e.g., a zone corresponding at least partly to the reflow phase of the solder process), is set or controlled to a higher level than the amount of cooling of the gas by a different gas purification unit dedicated to a zone, in which a low or lower temperature due to the soldering process is present (e.g., a zone corresponding at least partly to the soak phase of the soldering process). Preferably, different amounts of cooling of the gas in different gas purification units are achieved by differently configured means for controlling the cooling (e.g., differently sized or controlled condensers) or by the absence of cooling in one gas purification unit whereas cooling is present in another gas purification unit. The different cooling makes use of the locally different temperature in the oven.

Preferably, the amount of particle filtering in a zone with higher occurrence of particles within the gas is higher than in a zone with lower occurrence of particles. E.g. the filter density or number of layers of a particle filter is higher for resulting in a higher amount of particle filtering wherein the filter density or number of layers of a particle filter is lower for resulting in a lower amount of particle filtering; alternatively, a particle filter is present in one gas purification unit and not present in another gas purification unit.

Preferably, one gas purification unit of the at least two gas purification units is setup for catalyst cleaning (i.e. comprising a catalyst unit comprising a catalyst material) and another gas purification unit of the at least two gas purification units is set up for cleaning by condensation.

It is readily apparent that the different adaptation methods (air flow, heating, cooling, particle filtering, cleaning principle) may be combined with each other, influencing each other's necessary/advantageous amount of adaption of the gas purification unit to the dedicated zone. This has become possible by this invention because different gas purification units are dedicated to different zones.

In a further preferred embodiment according to the present invention one of the at least two gas purification units comprises a catalyst unit comprising a catalyst material. In a further preferred method according to the invention an accordingly configured gas purification unit is used.

By this, the gas purification can be performed well at a higher temperature level. This is, depending on the usual process temperature inside the zone, to which the gas purification unit is dedicated, more efficient than cooling down the gas by the condenser.

Preferably, the catalyst material contains an oxidation catalyst. Preferably, the catalyst material is arranged according to a honeycomb structure. It may alternatively have a bead structure (e.g., ceramic catalyst balls) or plate structure.

Preferably, more than one, e.g. 2, 3, 4, 5 or more or even all of the at least two gas purification units comprise a catalyst unit comprising a catalyst material.

In a further preferred embodiment according to the present invention at least a further one of the at least two gas purification units comprises a catalyst unit comprising a catalyst material, such that the oven comprises at least two catalyst units, and the at least two catalyst units differ from each other in at least one of the following:

the chemical composition and/or a geometrical structure of the catalyst material, an air flow through the catalyst material, an amount of preheating of the gas before impinging on the catalyst material, an amount of particle filtering before and/or after the catalyst material. In a further preferred method according to the invention, air flow and/or preheating through the at least two catalyst units is controlled differently and/or a different chemical composition and/or geometrical structure of the catalyst material and/or different particle filtering is used.

Hereby, the cleaning performance of the catalyst units can be adapted to the locally different cleaning needs advantageously and in a flexible way.

Preferably, the chemical composition of the catalyst material of a catalyst unit dedicated to a zone, in which a high temperature due to the soldering process is present (e.g., a zone corresponding at least partly to the reflow phase of the process), features a higher optimal catalyst reaction temperature than the chemical composition of a catalyst material of a different catalyst unit dedicated to a zone, in which a low or lower temperature due to the soldering process is present (e.g., a zone corresponding at least partly to the soak phase of the soldering process). Hereby, the catalyst material is advantageously adapted to temperatures present due to the soldering process and therefore, the cleaning is efficient and the amount of necessary preheating is lower or even not necessary (e.g. in cleaning of zones where a low temperature is present and the catalyst material is adapted to this lower temperature). The chemical composition of the catalyst material compensates for the soldering-process-determined temperature differences within the oven.

Preferably, the geometrical structure of the catalyst material is chosen from honeycomb structure, bead structure and plate structure to adapt to locally different needs. As an example, criterions of the choice may be one or more of the following: the ease of exchange or recyclability (if the catalyst is exhausted), the needed or preset air flow through the material, the price, the lifetime given the locally present vaporization within the dedicated zone, the resulting dimensions of the catalyst.

Preferably, the air flow through the catalyst material of a catalyst unit dedicated to a zone, in which a high vaporization due to the soldering process is present (e.g., a zone corresponding at least partly to the reflow phase of the solder process), is set or controlled to a higher level than the air flow through the catalyst material of a different catalyst unit dedicated to a zone, in which a low or lower vaporization due to the soldering process is present (e.g., a zone corresponding at least partly to the soak phase of the soldering process). Preferably, different air flows in different catalyst units are achieved by differently configured means for controlling the air flow (actively: e.g., a fan; and/or passively: e.g., a predetermined or adjustable orifice). Hereby, the different air flow conditions through the catalyst materials of different catalyst units compensate for the locally different vaporization in the oven.

Preferably, the amount of preheating of the gas by a catalyst unit dedicated to a zone, in which a high temperature due to the soldering process is present (e.g., a zone corresponding at least partly to the reflow phase of the solder process), is set or controlled to a lower level (or even zero) than the amount of preheating of the gas by a different catalyst unit dedicated to a zone, in which a low or lower temperature due to the soldering process is present (e.g., a zone corresponding at least partly to the soak phase of the soldering process). Preferably, different amounts of preheating of the gas in different catalyst units are achieved by differently configured means for controlling the preheating or by the absence of preheating in one catalyst unit whereas preheating is present in another catalyst unit. The different preheating makes use of the locally different temperature in the oven. Preheating is only done where needed and hence, energy consumption is lowered.

The different amount of particle filtering has already been described above and is applicable here as well.

It is readily apparent that the different adaptation methods (chemical composition, geometrical structure, air flow, preheating, particle filtering) may be combined with each other and with those described above for general gas purification units, influencing each other's necessary/advantageous amount of adaption of the catalyst unit to the dedicated zone. This has become possible by this invention because different catalyst units are dedicated to different zones.

In a further preferred embodiment according to the present invention at least two of the gas purification units are equipped with a diagnostic system configured to measure an efficiency of the respective gas purification unit. In a further preferred method according to the present invention the efficiencies of at least two of the gas purification units are measured.

Hereby, the different efficiency states of different gas purification units can be comfortably monitored. The efficiency is indicating the contamination state of the gas purification unit, e.g. the contamination state of a catalyst material, making it not necessary to exchange all gas purification units at once but only those that are exhausted. This enhances comfort and costs when using different gas purification units. A diagnostic system is for example a measurement of gas pressure or chemical component (e.g., glycol ethers) concentration before and after the cleaning medium (e.g. catalyst material or condenser), hence a pressure drop measurement or chemical component difference measurement, and if the pressure drop is getting too high (e.g. exceeds a threshold) or the chemical component difference is getting too low the diagnostic system signalizes it. The diagnostic system may also work instead or additionally with absolute values of pressure/chemical component concentration.

Figure 2:
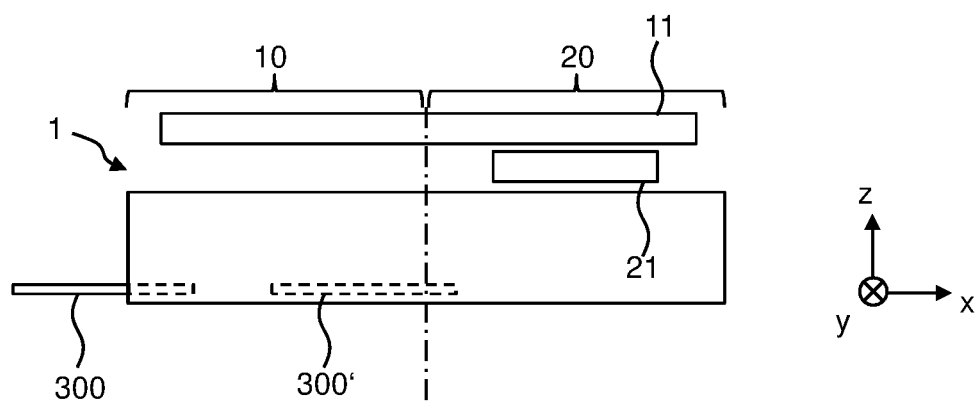
Figure 3:
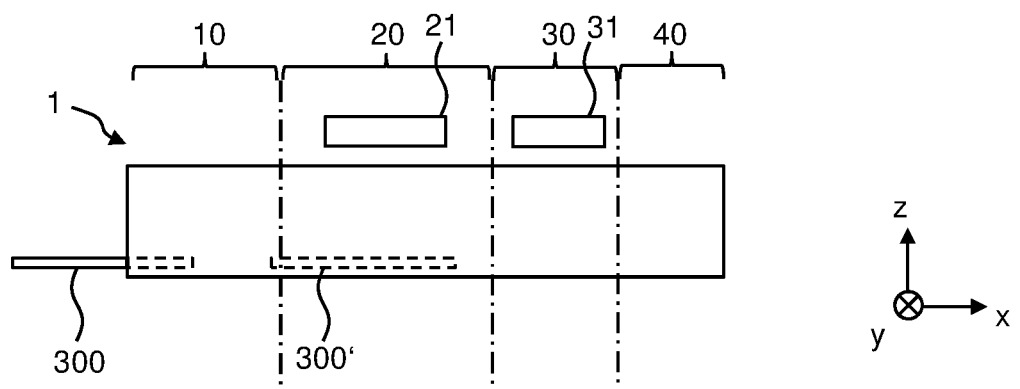
Figure 4:
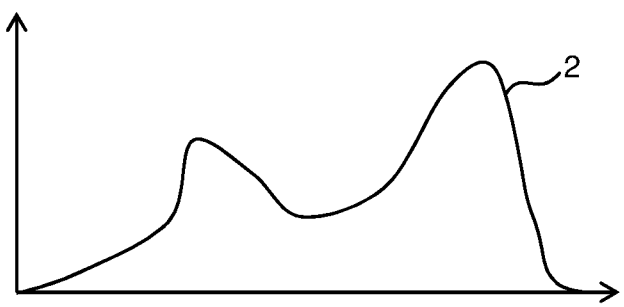

Embodiments of the present invention will now be described—by way of example only—with reference to the accompanying drawings:

FIG. 1, FIG. 2, FIG. 3, FIG. 5a, 5b, FIG. 6 and FIG. 7, are functional outlines of reflow soldering ovens according to the invention, wherein FIG. 4 roughly shows the amount of vapor along travel direction of the electronic circuit board within the oven during operation of the soldering oven. Preferably, the oven shown in the Figures also comprises similar arrangement of components on the bottom side of the electronic circuit board.

FIG. 1 shows a reflow soldering oven 1 for soldering an electronic circuit board 300. The board 300 enters from the left and exits on the right. The board 300 is shown at a later stage as circuit board 300' inside the oven 1. The oven 1 comprises a gas purification system for purifying gas that contains flux components vaporized from the electronic circuit board 300. The gas purification system comprises at least one gas purification unit 11 comprising a catalyst comprising a catalyst material. Preferably (hence dotted draw style), it comprises at least a further gas purification unit 21 wherein the two gas purification units 11, 21 are dedicated to different zones 10, 20 of the reflow soldering oven 1. Here, gas purification unit 11 is dedicated to zone 10 and gas purification unit 21 to zone 20.

During operation of the oven 1 the electronic circuit board 300 is soldered and gas that contains flux components vaporized from the electronic circuit board 300 is purified by the gas purification system. The two gas purification units 11, 21 are used to purify gas originating from the different zones 10, 20.

Hereby, the gas can be cleaned more efficiently as the different gas purification units 11, 21 can be adapted to the amount of vapor in the zones 10 and 20.

Furthermore, this exemplary embodiment shows the arrangement of the different zones 10, 20, in series to each other along a travel direction of the electronic circuit board 300.

FIG. 2 shows a similar reflow soldering oven 1 as in FIG. 1, however, here the gas purification unit 11 is dedicated to the group of zones 10 and 20 and gas purification unit 21 is only dedicated to zone 20. Hereby, gas purification unit 11 has a general purifying function whereas gas purification unit 21 has a pre-purifying or pre-filter function for gas/air coming from zone 20. This is useful for example in the case that zone 20 has a higher vaporization emergence than zone 10.

FIG. 3 shows a similar reflow soldering oven 1 as in FIG. 1, however, the oven 1 comprises different zones 10, 20, 30, and 40 and a gas purification unit 31 is dedicated to zone 30 and gas purification unit 21 to zone 20. Not all of the zones have a gas purification unit dedicated to it. Here, zone 20 represents a soak zone and zone 30 the reflow zone. In these zones 20, 30 most of the vapor is produced during operation of the oven 1, as can be seen in FIG. 4. By this setup, gas purification unit 21 can be adapted to the lower amount of vapor in zone 20 and gas purification unit 31 to the higher amount of vapor in zone 30, allowing for very efficient cleaning.

Figure 5A:
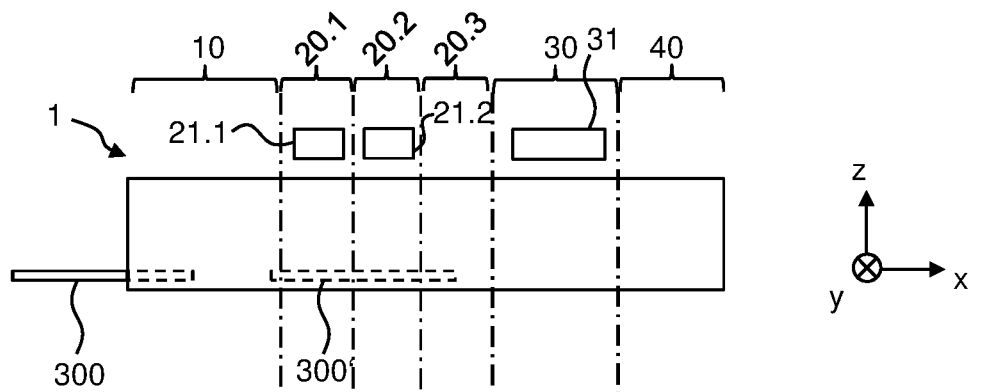
Figure 5B:
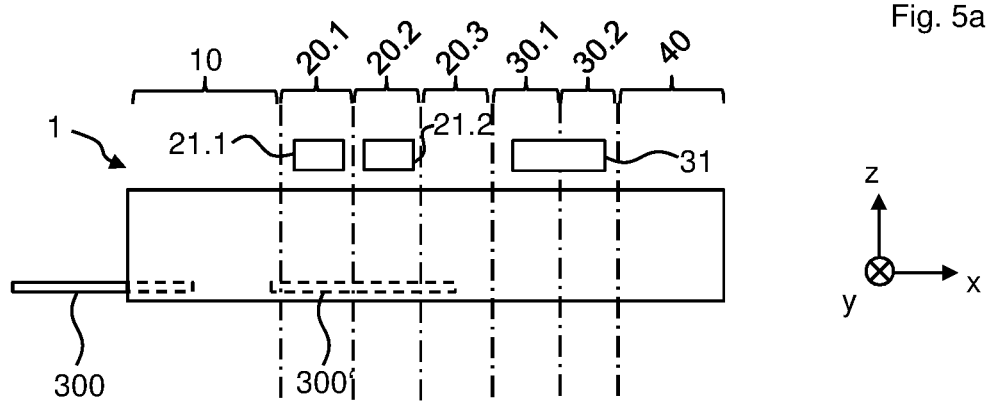

FIGS. 5a and 5b show ovens 1 similar to FIG. 3, however with a finer graduation of zones. The soak area (in FIG. 3 zone 20) is built of zones 20.1, 20.2 and 20.3, a gas purification unit 21.1 is dedicated to zone 20.1 and gas purification unit 21.2 is dedicated to zone 20.2. This allows for an even more specific cleaning of vapor where it is needed. FIG. 5b shows an oven 1 with the reflow area (in FIG. 5a zone 30) being built of zones 30.1 and 30.2 and a gas purification unit 31 is dedicated to zones 30.1 and 30.2. This shows how flexible the inventive principle can be applied to achieve a locally adapted gas purification arrangement.

Figure 6:
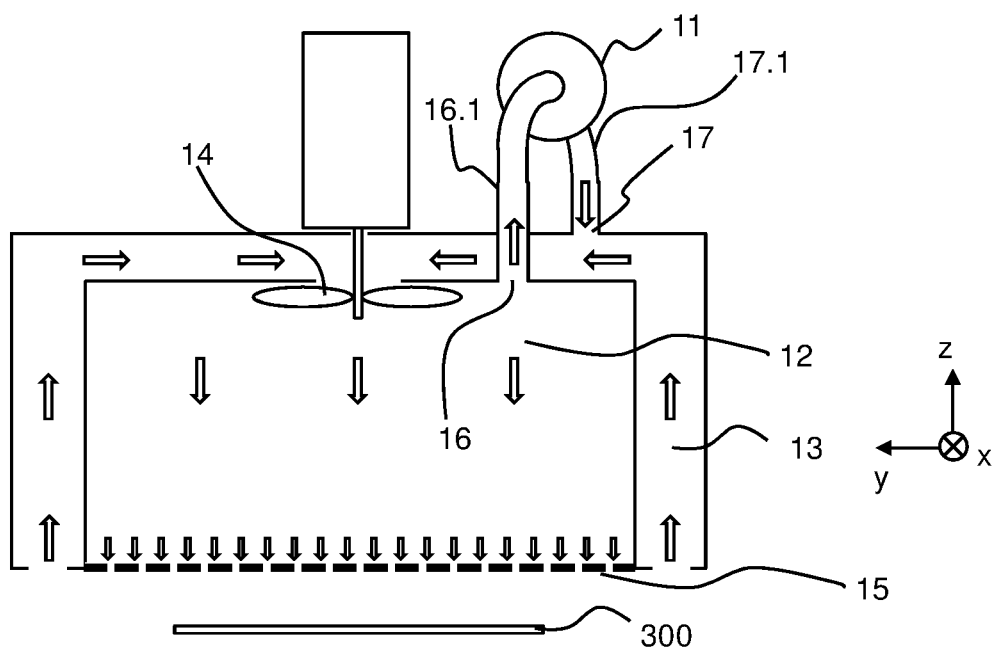

FIG. 6 is a cross-sectional view through a zone 10 of a further embodiment of the oven 1 based on at least FIG. 1. The oven 1 comprises a cleaning exhaust 16 through which gas to be cleaned by the gas purification unit 11 can be exhausted out of the oven. The oven 1 comprises
    a blower box chamber 12 having a a perforated wall 15 facing a travel path of the electronic circuit board 300 and separating/delimiting the blower box chamber 12 from the travel path,
    adjacent, and surrounding at two three sides a return chamber 13,
    and a fan 14, which is configured to suck gas from the return chamber 13, blow it into the blower box chamber 12 and then through the perforated wall onto the electronic circuit board 300, wherein the blower box 12 comprises the cleaning exhaust 16 to which a pipe 16.1 is connected which pipe 16.1 is connected an inlet of the gas purification unit 11. The fan is arranged directly next to an orifice connecting blower box chamber and return chamber. The travel path of gas at the position of the electronic circuit board through the return chamber to the fan is longer than the travel path from the fan through the blower box to the electronic circuit board. The return chamber has two vertical outer walls. Preferably multiple zones of the oven each comprise such arrangement of blower box chamber and return chamber. The return chamber 13 comprises a cleaning inlet 17 to which a pipe 17.1 is connected which pipe 17.1 is connected to an outlet of the gas purification unit 11.

Figure 7:
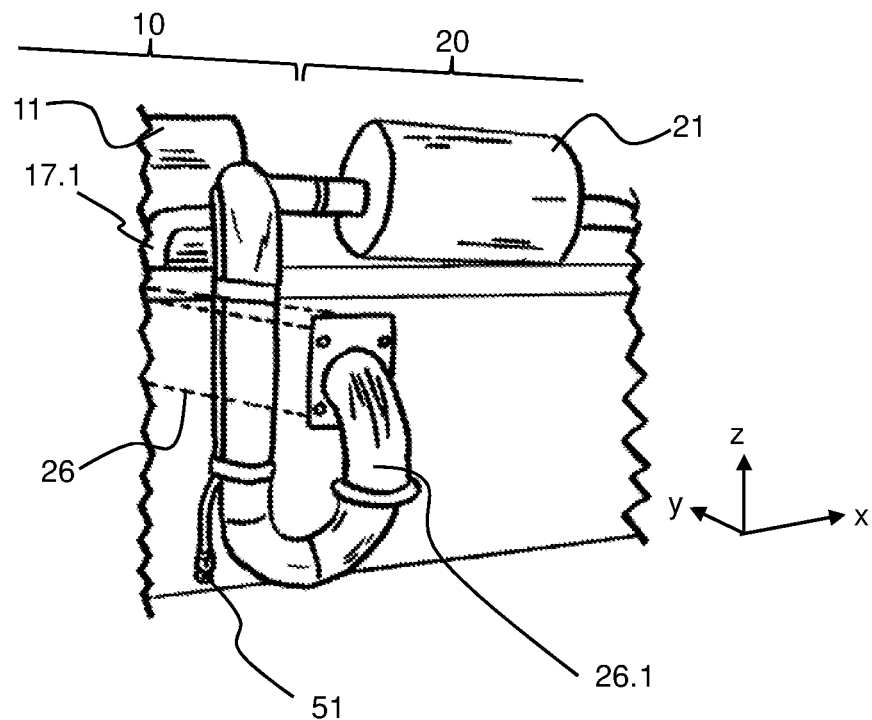

FIG. 7 is a side view on a further embodiment of the oven 1 based on at least FIG. 1. The oven 1 comprises a cleaning exhaust 26 (inside the oven 1 hence dashed drawing style) through which gas to be cleaned by the gas purification unit 21 can be exhausted out of the oven. The cleaning exhaust 26 extends across a travel path of the electronic circuit board 300. The cleaning exhaust 26 is arranged between two zones 10, 20 of the reflow soldering oven 1. Zone 10 is a Peak zone and the other zone 20 is subsequent in travel direction of the electronic circuit board 300 and is a Cool zone 9. The gas purification system is connected to the oven 1 using a gas duct system (pipe 26.1 being part of that duct system), wherein the gas duct system comprises a Venturi pump having an injection connector 51 for external gas feeding such that the external gas accelerates a gas flow inside the gas duct system.

In FIG. 6 and FIG. 7, the gas purification unit 11 (and in FIG. 7 also unit 21) is housed in a housing having an extension $e_x$ in the horizontal direction parallel to the travel direction of the electronic circuit board 300 and an extension $e_z$ in the vertical direction perpendicular to the travel direction of the travel direction of the electronic circuit board (300), wherein $e_x > e_z$. The housing is a horizontally extending cylinder and the cylinder axis substantially parallel to the travel direction of the electronic circuit board 300.

By this invention, a new reflow oven and new method for reflow soldering is introduced. This reflow oven preferably features different gas purification units that are arranged such that they clean gas from inside the oven that originates from distinct areas inside the oven. Thereby, the locally different vaporization can be compensated and with less energy or costs the same or even better purification of gas is achieved.

REFERENCE SIGNS 1 reflow soldering oven
10 zone
11 gas purification unit
12 blower box chamber
13 return chamber
14 fan
15 perforated wall
16 cleaning exhaust
16.1 pipe
17 cleaning inlet
17.1 pipe
20 zone
20.1 zone
20.2 zone
20.3 zone
21 gas purification unit
21.1 gas purification unit
21.2 gas purification unit
26 cleaning exhaust
26.1 pipe
30 zone
30.1 zone
30.2 zone
31 gas purifcation unit
40 zone
51 connector
300 electronic circuit board

The invention claimed is:

1. Reflow soldering oven (1) for soldering an electronic circuit board (300), the oven (1) comprising a gas purification system for purifying gas that contains flux components vaporized from the electronic circuit board (300),
    characterized in that,
    the gas purification system comprises at least one gas purification unit (11, 21, 21.1, 21.2, 31) comprising a catalyst unit comprising a catalyst material,
    wherein the gas purification system is connected to the oven (1) using a gas duct system, wherein the gas duct system comprises a Venturi pump having an injection connector (51) for external gas feeding such that the external gas accelerates a gas flow inside the gas duct system.

2. Oven (1) according to claim 1, wherein the oven comprises a control unit controlling a temperature of gas impinging on the catalyst material of the at least one gas purification unit (11, 21, 21.1, 21.2, 31) within the range of 180-215° C.

3. Oven (1) according to claim 1, wherein the at least one gas purification unit (11, 21, 21.1, 21.2, 31) is dedicated to a cool zone of the reflow soldering oven (1).

4. Oven (1) according to claim 1, wherein the oven (1) comprises a cleaning exhaust (16, 26) through which gas to be cleaned by the at least one gas purification unit (11, 21, 21.1, 21.2, 31) can be exhausted.

5. Oven (1) according to claim 4, wherein the oven (1) comprises
    a blower box chamber (12) having a wall (15) permeably to air facing a travel path of the electronic circuit board (300),
    a return chamber (13),
    and a fan (14), which is configured to suck gas from the return chamber (13), blow it into the blower box chamber (12) and then through wall (15) onto the electronic circuit board (300), wherein the blower box (12) comprises the cleaning exhaust (16) to which a pipe (16.1) is connected which pipe (16.1) is connected to an inlet of the gas purification unit (11).

6. Oven (1) according to claim 5, wherein the return chamber (13) comprises a cleaning inlet (17) to which a pipe (17.1) is connected which pipe (17.1) is connected to an outlet of the gas purification unit (11).

7. Oven (1) according to claim 4, wherein the cleaning exhaust (16, 26) extends across a travel path of the electronic circuit board (300).

8. Oven (1) according to claim 4, wherein the cleaning exhaust (26) extending across a travel path of the electronic circuit board (300) is arranged between two zones (10, 20, 20.1, 20.2, 20.3, 30, 30.1, 30.2, 40) of the reflow soldering oven (1).

9. Oven (1) according to claim 1, wherein the gas duct system of the oven (1) comprises a duct connecting an outlet of the at least one gas purification unit (11, 21, 21.1, 21.2, 31) to a gas curtain at an entrance or an exit of the oven (1).

10. Oven (1) according to claim 9, wherein the Venturi pump is arranged in a part of the duct system connecting said at least one gas purification unit (11, 21, 21.1, 21.2, 31), the outlet of which is connected to the gas curtain at the entrance or exit of the oven (1), to the oven (1).

11. Oven (1) according to claim 1, wherein the gas purification system comprises at least a further gas purification unit (11, 21, 21.1, 21.1, 31) such that it comprises at least two gas purification units (11, 21, 21.1, 21.2, 31), wherein the at least two gas purification units (11, 21, 21.1, 21.2, 31) are dedicated to different zones (10, 20, 20.1, 20.2, 20.3, 30, 30.1, 30.2, 40) of the reflow soldering oven (1).

12. Oven (1) according to claim 11, wherein the oven (1) comprises two ducts, a first duct connecting an outlet of at least one of the at least two gas purification units (11, 21, 21.1, 21.2, 31) to a gas curtain at an entrance of the oven (1), a second duct connecting an outlet of another of the at least two gas purification units (11, 21, 21.1, 21.2, 31) to a gas curtain at an exit of the oven (1).

13. Oven (1) according to claim 12, wherein the at least one gas purification unit (11, 21, 21.1, 21.2, 31) or several or all of the existing gas purification units (11, 21, 21.1, 21.2, 31) and are each housed in a housing having an extension $e_x$ in the horizontal direction parallel to the travel direction of the electronic circuit board (300) and an extension $e_z$ in the vertical direction perpendicular to the travel direction of the travel direction of the electronic circuit board (300), wherein $e_x > e_z$.

14. Method for reflow soldering an electronic circuit board (300) by a reflow soldering oven (1), wherein gas that contains flux components vaporized from the electronic circuit board (300) is purified by a gas purification system, characterized in that,
at least one gas purification unit (11, 21, 21.1, 21.2, 31) comprising a catalyst unit comprising a catalyst material is used to purify the gas,
wherein the gas purification system is connected to the oven (1) using a gas duct system, wherein the gas duct system comprises a Venturi pump having an injection connector (51) for external gas feeding such that the external gas accelerates a gas flow inside the gas duct system.

\* \* \* \* \*